(12) United States Patent
Vellore et al.

(10) Patent No.: US 6,598,559 B1
(45) Date of Patent: Jul. 29, 2003

(54) TEMPERATURE CONTROLLED CHAMBER

(75) Inventors: Kim Vellore, San Jose, CA (US); Qiwei Liang, Fremont, CA (US); Erwin Polar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/534,834

(22) Filed: Mar. 24, 2000

(51) Int. Cl.[7] ............................ C23C 16/00; C23F 1/02
(52) U.S. Cl. ............................ 118/723 VE; 118/723 R
(58) Field of Search .................... 118/715, 723 VE, 118/723 ME, 723 R

(56) References Cited

U.S. PATENT DOCUMENTS

| | | | |
|---|---|---|---|
| 4,184,188 A | 1/1980 | Briglia | |
| 4,384,918 A | 5/1983 | Abe | |
| 4,399,016 A | 8/1983 | Tsukada et al. | |
| 4,480,284 A | 10/1984 | Tojo et al. | |
| 4,665,463 A | 5/1987 | Ward et al. | |
| 4,753,192 A * | 6/1988 | Goldsmith et al. | 118/725 |
| 4,778,326 A | 10/1988 | Althouse et al. | |
| 4,780,372 A | 10/1988 | Tracy et al. | |
| 4,832,781 A | 5/1989 | Mears | |
| 5,104,834 A | 4/1992 | Watanabe et al. | |
| 5,140,940 A * | 8/1992 | Lindner | 118/724 |
| 5,151,845 A | 9/1992 | Watanabe et al. | |
| 5,213,349 A | 5/1993 | Elliott | |
| 5,255,153 A | 10/1993 | Nozawa et al. | |
| 5,270,266 A | 12/1993 | Hirano et al. | |
| 5,280,156 A | 1/1994 | Niori et al. | |
| 5,314,541 A * | 5/1994 | Saito et al. | 118/725 |
| 5,338,827 A | 8/1994 | Serafini et al. | |
| 5,729,423 A | 3/1998 | Donde et al. | |
| 5,837,555 A * | 11/1998 | Kaltenbrunner et al. | 118/724 |
| 5,872,889 A * | 2/1999 | Kaltenbrunner et al. | 392/418 |
| 6,015,465 A * | 1/2000 | Kholodenko et al. | 118/719 |
| 6,165,311 A | 12/2000 | Collins et al. | |
| 6,258,170 B1 * | 7/2001 | Somekh et al. | 118/715 |
| 6,307,184 B1 * | 10/2001 | Womack et al. | 118/725 |
| 6,326,597 B1 * | 12/2001 | Lubomirsky et al. | 219/494 |

FOREIGN PATENT DOCUMENTS

| | | |
|---|---|---|
| EP | 0171011 A2 | 2/1986 |
| EP | 0439000 A1 | 1/1991 |
| EP | 0452222 A1 | 10/1991 |
| EP | 0473930 A1 | 3/1992 |
| EP | 0635869 A1 | 1/1995 |
| JP | 63031732 | 2/1988 |
| JP | 1-298721 | 12/1989 |
| JP | 2-27748 | 1/1990 |
| JP | 02-283700 | * 11/1990 |
| JP | 3286834 | 12/1991 |
| JP | 3286835 | 12/1991 |
| JP | 4367247 | 12/1992 |
| JP | 5069489 | 3/1993 |

OTHER PUBLICATIONS

"Silicon Nitride Powder"–Reade. http://www.reade.com/Products/Nitrides/silicon_nitride.html.

"Nano–Sized Powders"–Reade. http://www.reade.com/Products/Nitrides/Silicon_Nitride.html.

(List continued on next page.)

Primary Examiner—Benjamin L. Utech
Assistant Examiner—Sylvia R. MacArthur
(74) Attorney, Agent, or Firm—Ashok Janah; Joseph Bach

(57) ABSTRACT

A substrate processing chamber 25 comprising a substrate support 85, and a wall 24 about the substrate support 85, the wall 24 having a radiation absorbing surface 36 adapted to preferentially absorb radiation having wavelengths in the visible or infra-red spectrum.

36 Claims, 3 Drawing Sheets

OTHER PUBLICATIONS

Figure 1:
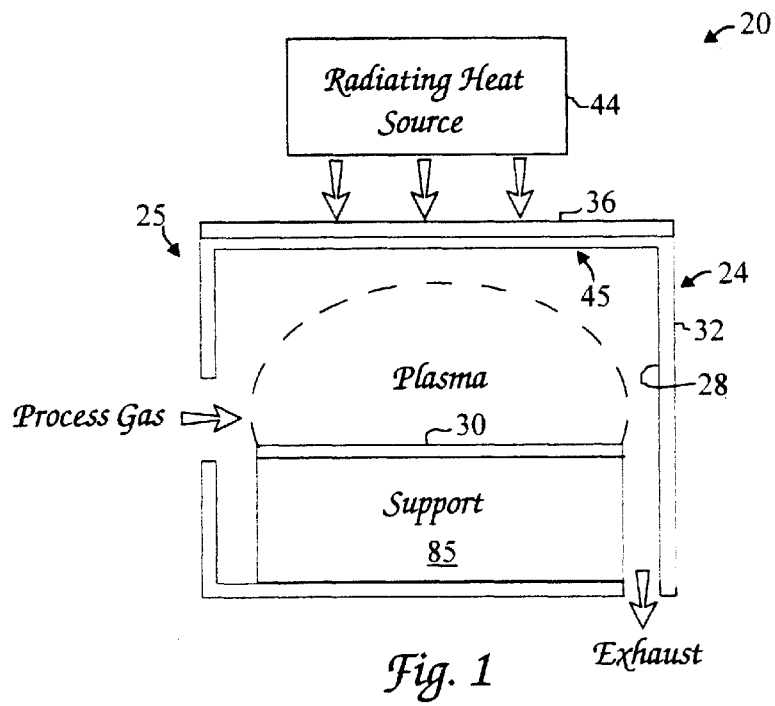

Klein, Allen J., "Curing Techniques for Composites," *Advanced Composites*, Mar./Apr. 1988, pp. 32–44.

Nakasuji, et al., "Low Voltage and High Speed Operating Electrostatic Wafer Chuck," *J. Vac. Sci. Technol. A.*, vol. 10, No. 6, Nov./Dec. 1992, pp. 3573–3578.

Arlon brochure, "55NT Multifunctional Epoxy on Aramid Non–woven Reinforcement," 7 pages.

Arlon brochure, "85NT Non–MDA Polyimide on Aramid Non–woven Reinforcement," 3 pages.

DuPont Advanced Fibers Systems brochure, "DuPont Thermount® Nonwoven Aramid Reinforcement for Printed Wiring Boards," 9 pages.

DuPont Advanced Fibers Systems brochure, "NOMEX® Aramid Paper type 410 Typical Properties," 8 pages.

"Kapton General Information," Technical Brochure from DuPont de Nemours Company, Wilmington, Delaware (1993).

"Kapton KJ" Technical Information from Dupont Films.

"R/flex® 1100 High Temperature Materials," Data Sheet DS20903D, Rogers Corporation, Chandler, Arizona (1993).

IBM Technical Disclosure Bulletin, vol. 31, No. 1, Jun. 1988, pp. 461–464, "Electrostatic Wafer Holder for Wafer Cooling During Reactive Ion Etching".

International Search Report dated Jun. 9, 1995.

U.S. Patent Application entitled, "An Electrostatic Chuck Having a Grooved Surface"; filed Jul. 20, 1993; Ser. No. 08/094,640; Inventor: Steger; Attorney Docket No. 260.

U.S. Patent Application entitled, "Protective Coating for Dielectric Material on Wafer Support Used in Integrated Circuit Processing Apparatus and Method of Forming Same," filed Apr. 22, 1993; Ser. No. 08/052,018, Inventors: Wu, et al.; Attorney Docket No. 428.

U.S. Patent Application entitled, "Electrostatic Chuck," filed Jan. 31, 1994; Ser. No. 08/189,562; Inventors: Shamouilian, et al.; Attorney Docket No. 527.

* cited by examiner

TEMPERATURE CONTROLLED CHAMBER

BACKGROUND

The present invention relates to temperature control in a chamber for processing a substrate.

In the fabrication of devices for electronic applications, semiconductor, dielectric and conductor materials, such as for example, polysilicon, silicon dioxide, and metal-containing layers, are formed on a substrate by chemical vapor deposition (CVD), physical vapor deposition (PVD), oxidation or nitridation processes. In a typical CVD process, a gas provided in the chamber is decomposed to deposit material on the substrate. In a typical PVD process, a target facing the substrate is sputtered to deposit the target material on the substrate. These materials may be etched in etching processes to form features such as gates, vias, contact holes and interconnect lines. In a typical etching process, a patterned etch-resistant material, such as resist or hard mask, is formed on the substrate, and exposed portions of the substrate are etched by an energized gas.

It is desirable to control the temperatures in the chamber and on the substrate especially when the substrate fabrication process is temperature dependent. In certain etching processes, such as for example, platinum or copper etching, an elevated temperature may be needed to etch the substrate, and in other etching processes, such as for example aluminum etching, a lower or more uniform temperature may be desirable. In yet other etching processes, the shape of the etched features may be dependent upon the substrate temperature. In CVD and PVD processes, the deposition rate may be dependent upon the temperature in the chamber and of the substrate. Thus it is desirable to control the temperatures in the chamber and of the substrate.

It is also desirable to maintain the temperatures across certain chamber surfaces at uniform or consistent levels. For example, residues formed on chamber surfaces can flake off due to thermal stresses that arise from temperature fluctuations in or between process cycles. The flaked off residues may fall upon and contaminate the substrate. Maintaining chamber surfaces at particular temperatures may also reduce deposition of process byproducts and residue on the surfaces.

Accordingly it is desirable to control the temperatures of substrate and chamber surfaces and reduce temperature fluctuations in or between process cycles.

It may also be desirable to have a chamber that can rapidly reach elevated temperatures from lower temperatures.

SUMMARY

The present invention satisfies these needs. In one aspect, the invention comprises a substrate processing chamber comprising a substrate support, and a wall about the substrate support, the wall having a radiation absorbing surface adapted to preferentially absorb radiation having wavelengths in the visible or infra-red spectrum.

In another aspect, a substrate processing apparatus comprises a chamber comprising a substrate support, the chamber having a wall with a radiation absorbing surface adapted to preferentially absorb radiation having wavelengths in the visible or infra-red spectrum, and a heat source to provide radiation to the radiation absorbing surface, the radiation having wavelengths in the visible or infra-red spectrum.

In yet another aspect, a method of processing a substrate, comprises placing a substrate in a chamber, providing a radiation absorbing surface on a wall of the chamber, the radiation absorbing surface adapted to preferentially absorb radiation having wavelengths in the visible or infra-red spectrum, and directing radiation having wavelengths in the visible, or infra-red spectrum against the radiation absorbing surface.

DRAWINGS

Figure 3:
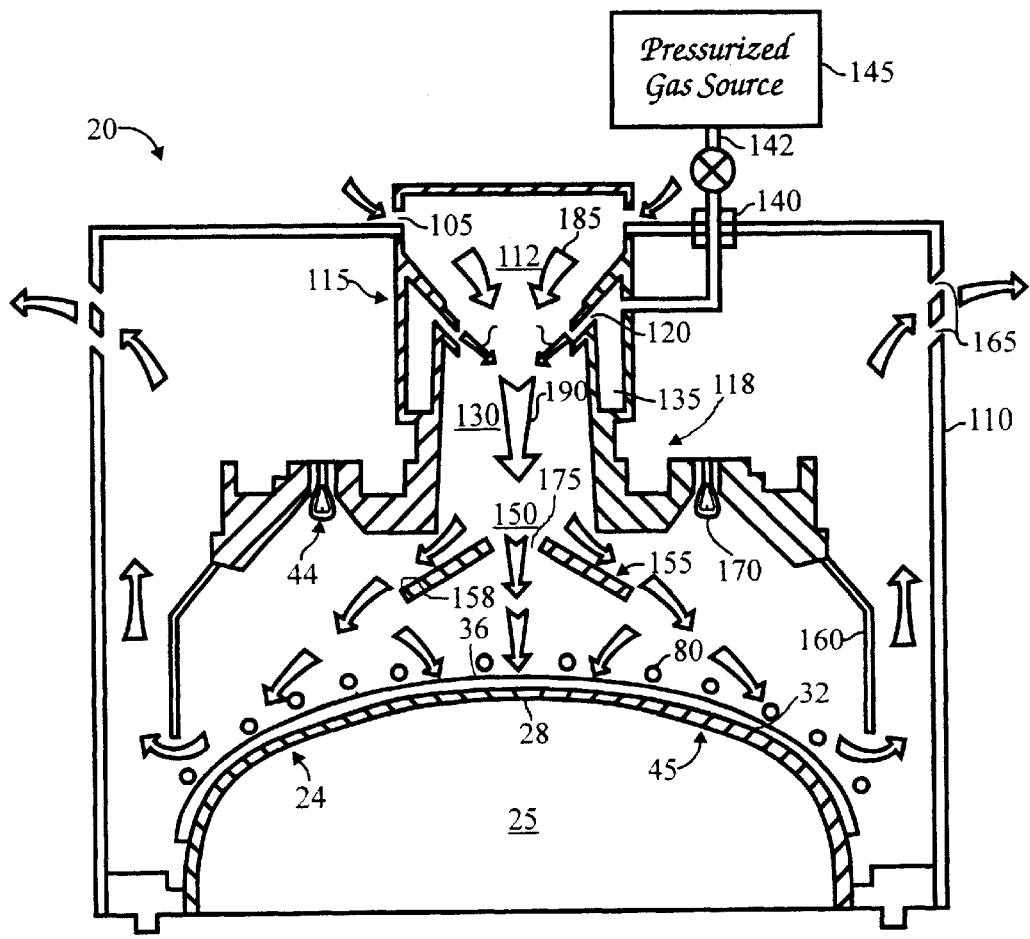
Figure 2:
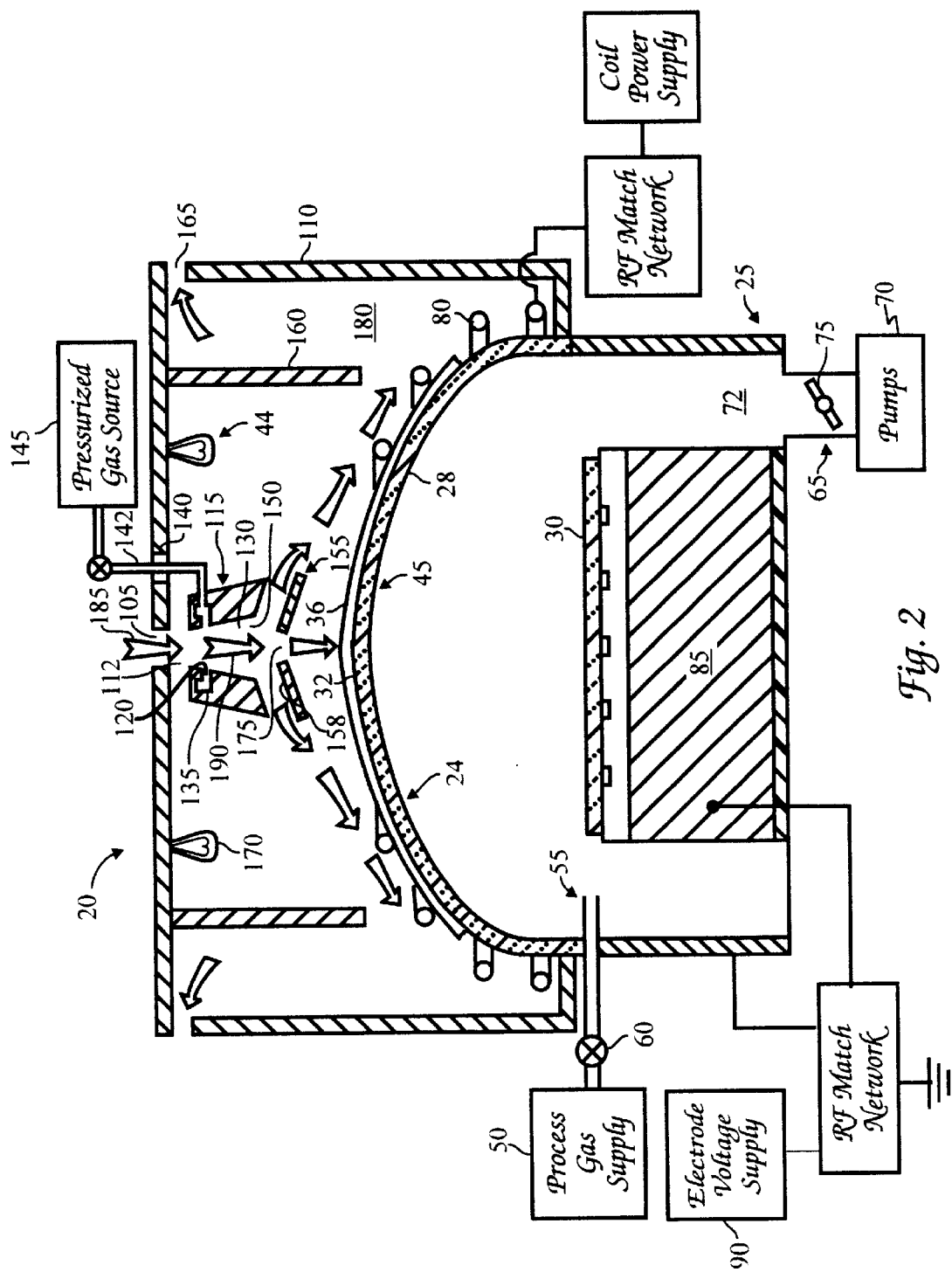
Figure 4:
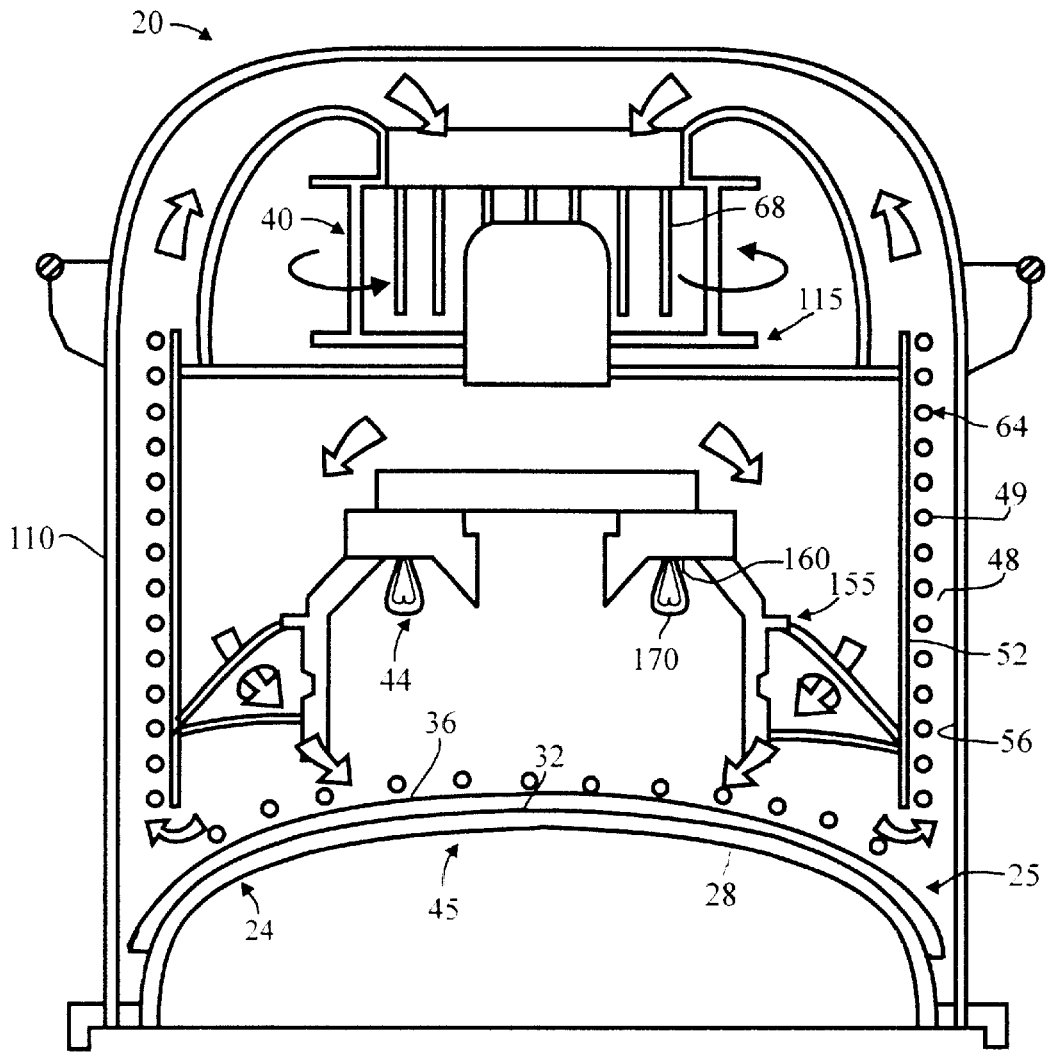

These and other features, aspects, and advantages of the present invention will be better understood from the following drawings, description and appended claims, which are provided to illustrate exemplary features of the invention and should not be used to limit the invention, where:

FIG. 1 is a schematic sectional side view of an apparatus according to the present invention comprising a chamber having a radiation absorbing surface; and FIGS. 2, 3 and 4 are schematic sectional side views of alternative embodiments of the apparatus according to the present invention.

DESCRIPTION

An exemplary embodiment of an apparatus 20 according to the present invention, is shown in FIG. 1. Generally, the apparatus 20 comprises walls 24 having interior and exterior surfaces 28, 32, respectively. The walls 24 may be adapted to define a chamber 25 and other optional abutting enclosures. The chamber 25 comprises a substrate support 85 to support a substrate 30 during processing in a process gas introduced from a process gas supply into the chamber 25. The process gas may be energized to form a dissociated gas or a plasma by an inductive, capacitive, or microwave energy source 44. The apparatus 20 may be adapted for plasma etching of the substrate, physical vapor deposition, chemical vapor deposition, non-plasma processes, or for other processes as apparent to one of ordinary skill in the art. The apparatus 20 is provided to illustrate the invention and should not be used to limit the scope of the invention.

The apparatus 20 comprises a radiation absorbing surface 36 to regulate a temperature of the wall 24. The radiation absorbing surface 36 may be on a portion of a wall 24, extend across an entire wall surface, or may be formed on a plurality of walls 24. In one version, the radiation absorbing surface 36 is adapted to preferentially absorb radiation having wavelengths in the infra-red or visible spectrum. This allows the radiation absorbing surface 36 to absorb infra-red or visible radiation that is incident on the surface 36 and thereby maintain the wall 24 and the surface 36 at more uniform, consistent, or higher temperatures. For example, the radiation absorbing surface 36 may have a reflectivity coefficient that is from about 1% to about 30%. In another embodiment, the radiation absorbing surface 36 comprises a reflectivity coefficient of less than about 15%. A lower reflectivity coefficient provides a higher radiation absorption coefficient which results in higher temperatures at the wall 24, while a higher reflectivity coefficient provides low heat absorption and low temperatures at the wall 24.

The color, value, and tone of the radiation absorbing surface 36 may strongly affect its radiation absorption characteristics. When the radiation absorbing surface 36 has a substantially dark color, such as a color having relatively dark value, a proportionately larger amount of radiation is absorbed than a light color having a relatively light value, such as white, silver, or reflective metallic colors, and consequently, the radiation absorbing surface 36 and its ancillary structure may be maintained at higher or more uniform temperatures. The dark color may be, for example, gray, gray-black, black or other such dark colors—but not a white or silver color, both of which generally have higher reflectivity coefficients, and consequently absorb less radiation in the visible or infra-red spectrum. The dark colors preferentially absorb radiation, relative to the lighter or paler colors. The radiation absorption characteristics may also, for example, be dependent upon the grain size of the material, the roughness of the surface, the impurities or their concentration within the material, or the surface texture and topography. Typically, a rough surface is preferred.

A heat source may be provided to direct radiation toward or onto the radiation absorbing surface 36. The heat source may be a radiating heat source 44, such as one or more lamps, lasers or LED's, as shown in FIG. 2, that are adjacent to, and oriented to face, the radiation absorbing surface 36 on the wall 24. Suitable lamps may be tungsten filament or halogen lamps. In one version, the lamps comprise ten tungsten filaments in a three phase delta configuration. These lamps are the advantageous because of the higher output levels of infra-red and visible radiation. Each lamp 170 may be surrounded by reflector 160 that is shaped to reflect the radiation originating from the lamp 170 toward the radiation absorbing surface 36. The lamps 170 and reflectors 160, may be enclosed in a top enclosure 110 that at least partially surrounds the radiation absorbing surface 36.

The combination of a radiation absorbing surface 36 and a radiating heat source 44 that directs radiation onto the surface 36 is capable of maintaining more uniform or higher temperatures across the surface 36. Consequently, the structure having the radiation absorbing surface 36, such as the wall 24, is also maintained at more uniform or higher temperatures. The predefined surface or wall temperatures may be selected to reduce the deposition or condensation of process residues on the surface 36. The temperatures may also be selected to vaporize process residues that deposit on the inside surface of the wall 32. In addition, when the thermal load inside the chamber 25 fluctuates, for example, when the plasma in the chamber 25 is turned on, off or increased in power level, the power level of the heat source 44 may also be adjusted to compensate for any change in temperature of the wall 24.

The apparatus 20 shown in FIG. 2 is suitable for plasma etching of a substrate 30, and is a schematic representation of a DPS chamber from Applied Materials, Santa Clara, Calif. During processing in this chamber 25, a substrate 30 is placed on the substrate support 85 in the energized gas zone. Process gas is introduced into the chamber 25 through a gas delivery system that comprises a process gas supply 50, a process gas distributor 55, and a gas flow controller 60. An exhaust system 65 comprising one or more exhaust pumps 70 (typically including a 1000 liter/sec roughing pump) and throttle valves 75 are used to exhaust spent process gas and to control the pressure of the process gas in the chamber 25. A pumping channel 72 around the substrate 30 receives spent process gas and allows the gas to be exhausted from the chamber 25.

In this version, the radiation absorbing surface 36 comprises an exterior surface 32 of a ceiling 45 of the chamber 25. The ceiling may be dome shaped, as shown, or may comprise other shapes, such as flat or planar ceiling, a multi-radius dome, or a cylindrical shape. In one version, the ceiling 45 comprises a multi-radius dome-shape that is centered above the substrate 30. The ceiling 45 can be made from a dielectric ceramic material, such as quartz or aluminum oxide, that is permeable to electromagnetic energy transmitted from above the ceiling 45. For example, the inductor antenna 80 adjacent to the ceiling of the chamber 25 may be used to inductively couple electromagnetic energy to the gas in the chamber 25 to form an energized gas, such as a plasma, in the energized gas zone. The inductor antenna 80 may comprise one or more coils and a power supply to power the coils. The ceiling 45 may also be made from a semiconducting material, such as for example, silicon, that serves as an induction field transmitting window, yet is also sufficiently electrically conductive to also serve as a process electrode. In the latter version, the ceiling 45 and the substrate support 85 may also be electrically biased by an electrode voltage supply 90 to capacitively couple to one another to energize the process gas in the chamber 25.

Thus, the temperature of the ceiling 45 of the chamber 25 may be regulated, or made more uniform, by having the radiation absorbing surface 36 on the ceiling. The radiation absorbing surface 36 may comprise a coating of radiation absorbing material applied onto the ceiling 45 or the ceiling may at least partially be made from a radiation absorbing material. For example, the radiation absorbing material may comprise one or more of silicon nitride, chromium oxide, vanadium oxide, or plasma spray coating. For example in one version of the radiation absorbing material comprises a mixture of $V_2O_5$ and $Cr_2O_3$, the mixture having a flat black color. Other mixtures of materials include $Al_2O_3$ and $TiO_2$; or $ZrO_2$ and $Al_2O_3$. These materials may be fabricated to form a surface layer 36 on the ceiling 45, or fabricated in the shape of a structural member that serves as the ceiling 45 and that has the desired radiation absorption characteristics. A suitable radiation absorbing coating is, for example, an plasma spray coating which is a alumina-titania coating plasma sprayed manufactured by. APS Materials, Inc, Dayton, Ohio. The radiation absorption coating is sprayed upon a dielectric ceiling fabricated from aluminum oxide. When the radiation absorbing material is applied as a coating on another structure, the radiation absorbing material should have a thermal expansion coefficient that is within about ±10% of the thermal expansion coefficient of the structure. Alternatively, the radiation absorbing surface 36 may be a surface of a component, such as a structural component, for example, the wall 24 of the process chamber 25, that is fabricated by molding or casting radiation absorbing material into a shape and finish machining the shape.

Referring to FIG. 2, optionally a radiative heat source 44 may also be provided to direct heat onto the ceiling surface 45 to maintain the wall 24, and consequently, the internal surface 28 of the chamber 25, at more stable temperatures. A suitable radiative heat source 44 comprises one or more heat lamps 170 such as for example, a visible or infrared spectrum lamp, LED or laser. However, other heat sources can also be used, such as electrical resistor heating elements positioned on or adjacent to the ceiling 45. To balance heat input, the power to the heat lamps 170 may be reduced when other heat sources are powered, for example, the heat generated from a plasma energized in the chamber. Each heat lamp 170 is surrounded by a reflector 160, such as an arcuate or parabolic mirror surface, that directs heat from the lamp 170 onto the ceiling 45.

Optionally, a top enclosure 110 surrounds and encloses the heat lamps 170, reflectors 160, and the radiation absorbing surface 36. The top enclosure 110 is typically cylindrical and sized to enclosed the ceiling 45 of the chamber 25 and adjacent components, but it may also have other shapes, such as dome or cube-shaped. Typically, the top enclosure 110 is made of metal, but it may also be made of other materials, such as polymer.

Optionally, a gas circulating system 115 may be provided in the top enclosure 110 to direct a stream of gas, such as air, against the radiation absorbing surface 36. The gas circulating system 115 may comprise a fan or other apparatus to pass a gas, such as air or a non-reactive or inert gas, across the radiation absorbing surface 36. The gas circulating system 115 is provided to maintain more uniform temperatures on the surface 36, or to more rapidly heat or cool the surface 36. In the version shown in FIG. 2, the gas circulating system 115 comprises a top enclosure 110 containing a gas flow amplifier 118 and gas vents 105, 165 to provide a larger gas flow across the radiation absorbing surface 36. The gas vents in the top enclosure 110 open to the external environment, and they typically include both egress and ingress vents 105, 165, respectively. The gas ingress vent 105 leads from the external environment to an inlet 112 of the gas circulating system 115. The gas egress 165 vents to the external environment from the sidewall of the top enclosure 110. The gas circulating system 115 comprises a nozzle 120 that ejects a pressurized gas stream 125 in a downward direction into a central opening 130. The nozzle 120 is above or slightly below an inlet 112 of the gas circulating system 115 and is typically oriented at an angle of 30 to 90 degrees relative to the outlet 150. Pressurized gas is supplied to a reservoir 135 from an external pressurized gas source 145 via the gas line 140, the pressurized gas being typically at a pressure of from about 1 mTorr to about 1000 Torr. The pressurized gas stream 125 ejected from the nozzle 120 is at high velocities and consequently generates a low pressure regime in the gas circulating system 115 that draws in a secondary gas stream 185 through the inlet of the gas circulating system 115. The combined gas streams 190 propels a large volume of gas out of the outlet 150 and toward the radiation absorbing surface 36 of the chamber 25. The forced air flow impinging upon the radiation absorbing surface 36 maintains the surface at more uniform, higher or lower temperatures.

Optionally, a gas deflector 155 may be positioned in the flow path of the combined gas stream 190 to pass the combined gas stream 190 across a larger portion of, or the entire, radiation absorbing surface 36. The gas deflector 155 is typically disposed between the exterior surface 100 of the chamber 25 and the outlet 150 of the gas circulating system 115. In one version, the gas deflector 155 comprises a flared conical surface 158 having a centrally positioned orifice 175. The conical surface 158 deflects a portion of the gas stream gas radially outward toward outer portions of the radiation surface 36 while the central orifice 175 directs a portion of the gas stream toward the center of the radiation absorbing surface 36. The diameter of the gas deflector 155 may be typically about as large as the diameter of the gas flow amplifier outlet 150 and smaller than the diameter of the radiation absorbing surface 36. For example, the diameter of the gas deflector 155 may be at least 5% larger than the diameter of the outlet 150. The surface of the gas deflector 155 is smooth or polished to provide a smoother gas flow surface.

FIG. 3 shows another version of an apparatus 20 comprising a different gas circulating system 115. In this version, the gas ingress duct 105 leads to the inlet 112 of the gas circulating system 115. The nozzle 120 of the gas circulating system 115 is sized to direct a relatively narrow and high velocity stream 125 of gas downward and through the central opening 130. The narrow gas stream 125 sucks in the secondary gas stream 185 through the inlet 112 providing an amplified or larger gas stream 190 that is propelled from the outlet 150 of the gas circulating system 115 toward the exterior surface 32 of the chamber 25. The deflector 155 deflects a portion of the combined gas flow stream 190 toward the inner sidewalls of the dome-shaped ceiling 45—which also aid in directing a portion of the gas stream toward the periphery of the ceiling 45. As fresh gas enters the top enclosure 110 from the gas inlet 112, an approximately equal volume of gas is pushed out of the top enclosure 110 through the egress vent 165. In this version, the gas flow steam 125 is reflected off or directed away from the domed ceiling 45 and the bottom of the enclosure 110, and it is pushed upward between the enclosure 110 and its inner sidewalls 24 and exits through the egress vent 165.

FIG. 4 shows another embodiment of the present invention in which the gas circulating system 115 comprises a rotating fan assembly. In this version, the heat lamps 170 provide radiating energy that heats the radiation absorbing surface 36 to maintain the temperature of the wall 24 relatively stable in the chamber 25. In addition, when a plasma is first formed during substrate processing, the large additional heat load in the chamber 25 may cause the wall 24 to rise in temperature until it reaches a new equilibration temperature. This additional heat load may be partially dissipated by the overhead fan 40 that is enclosed in the top enclosure 110 and that blows recirculated air onto the surface 36 of the chamber 25. Generally, the air flows down across the surface 36 of the chamber 25 up an annular passageway 48 defined by an inner wall 52 and the sides 56 of the top enclosure 110. The passageway 48 includes a heat exchanger 64 comprising fluid recirculating coils 49. For example, the air flowing through the passageway 48 may be cooled by passing chilled fluid through the coils 49. The cooled air re-enters the fan 40 from the sides of the fan blades 68 and is redirected toward the ceiling of the chamber 25.

The present invention provides a method of processing a substrate 30, in which the substrate 30 is placed in a chamber 25 having a radiation absorbing surface 36 on a wall 24. Radiation having wavelengths in the visible or infra-red spectrum are directed against the radiation absorbing surface 36: Optionally, a gas may be circulated against the radiation absorbing surface 36 to obtain increased temperature stability and uniformity. The method maintains the wall 24 of the chamber 25 at uniform or consistent temperatures, even through changing thermal loads, such as when a plasma power is turned on or off in the chamber 25. The invention may also be used to reduce the deposition of process residues on chamber surfaces, or to prevent the flaking of process residues from chamber surfaces and resultant contamination of the substrate 30, when such deposition or flaking is temperature dependent. It may also be used to more uniformly heat chamber surfaces.

Although the present invention has been described in considerable detail with regard to the preferred versions thereof, other versions are possible. For example, the radiation absorbing surface 36 may be located inside the chamber 25 or it may be adapted for other heat sources. Therefore, the appended claims should not be limited to the description of the preferred versions contained herein.

What is claimed is:

1. A substrate processing chamber comprising:
   a substrate support, and
   a wall about the substrate support, the wall having a radiation absorbing surface with a substantially dark color adapted to preferentially absorb radiation having wavelengths in the visible or infra-red spectrum.

2. A chamber according to claim 1 wherein the radiation absorbing surface comprises a color that is substantially black.

3. A chamber according to claim 1 wherein the radiation absorbing surface comprises a reflectivity coefficient of less than about 30%.

4. A chamber according to claim 1 wherein the wall comprises a portion of an enclosure around the substrate support.

5. A chamber according to claim 1 wherein the radiation absorbing surface is an exterior surface of the wall.

6. A chamber according to claim 1 wherein the wall is dome shaped.

7. A chamber according to claim 1 further comprising a heat source adapted to apply heat to the radiation absorbing surface.

8. A chamber according to claim 7 wherein the heat source is adapted to emit radiation having wavelengths in the visible or infra-red spectrum.

9. A chamber according to claim 1 wherein the radiation absorbing surface comprises silicon nitride, vanadium oxide or chromium oxide, and has a substantially dark color.

10. A substrate processing apparatus comprising:
a chamber comprising a substrate support, the chamber having a wall with a radiation absorbing surface having a substantially dark color adapted to preferentially absorb radiation having wavelengths in the visible or infrared-spectrum; and
a heat source to provide radiation to the radiation absorbing surface, the radiation having wavelengths in the visible or infra-red spectrum.

11. An apparatus according to claim 10 wherein the radiation absorbing surface comprises a color that is substantially black.

12. An apparatus according to claim 10 wherein the radiation absorbing surface is on an exterior surface of the wall.

13. An apparatus according to claim 10 wherein the wall is dome shaped.

14. An apparatus according to claim 10 wherein the heat source comprises a lamp, LED or laser.

15. An apparatus according to claim 14 wherein the heat source is adapted to emit radiation having wavelengths in the visible or infra-red spectrum.

16. An apparatus according to claim 10 wherein the radiation absorbing surface comprises a reflectivity coefficient of less than about 30%.

17. An apparatus according to claim 10 comprising a top enclosure around the radiation absorbing surface and the heat source, the top enclosure having one or more vents to the external environment and a gas flow circulator to circulate a gas over the radiation absorbing surface.

18. An apparatus according to claim 17 wherein the gas flow circulator comprises one or more of a fan, gas nozzle, blower or gas flow amplifier.

19. An apparatus according to claim 10 wherein the radiation absorbing surface comprises silicon nitride, vanadium oxide or chromium oxide, and has a substantially dark color.

20. A method of processing a substrate, the method comprising:
placing a substrate in a chamber;
providing a radiation absorbing surface on a wall of the chamber, the radiation absorbing surface having a substantially dark color adapted to preferentially absorb radiation having,wavelengths in the visible or infra-red spectrum; and
directing radiation having wavelengths in the visible or infra-red spectrum against the radiation absorbing surface.

21. A method according to claim 20 comprising providing the radiation absorbing surface on an exterior surface of the wall of the chamber.

22. A method according to claim 20 comprising providing a radiation absorbing surface having a color that is substantially black.

23. A method according to claim 20 further comprising circulating a gas across the radiation absorbing surface.

24. An apparatus according to claim 20 comprising providing a radiation absorbing surface comprising silicon nitride, vanadium oxide or chromium oxide, and having a substantially dark color.

25. A substrate processing apparatus comprising:
chamber comprising a substrate support, the chamber having a wall comprising a radiation absorbing surface having a substantially dark color adapted to preferentially absorb radiation having wavelengths in the visible or intra-red spectrum, the surface comprising one or more of silicon nitride, vanadium oxide or chromium oxide, and having a reflectivity coefficient of less than about 30%; and
a heat source to provide radiation to the wall.

26. An apparatus according to claim 25 wherein the substantially dark color is substantially black.

27. A chamber according to claim 25 wherein the wall is an exterior wall.

28. A substrate processing apparatus comprising:
a chamber comprising a substrate support, the chamber having a wall comprising a radiation absorbing surface comprising one or more of vanadium oxide and chromium oxide; and
a heat source to provide radiation to the radiation absorbing surface.

29. A chamber according to claim 28 wherein the radiation absorbing surface comprises a substantially dark color adapted to preferentially absorb radiation having wavelengths in the visible or infra-red spectrum.

30. A chamber according to claim 28 wherein the wall comprises a coating having the radiation absorbing surface thereon.

31. A substrate processing apparatus comprising:
a chamber comprising a substrate support, the chamber having a wall comprising a radiation absorbing surface comprising a mixture of aluminum oxide and titanium oxide; and a heat source to provide radiation to the radiation absorbing surface.

32. A chamber according to claim 31 wherein the radiation absorbing surface comprises a substantially dark color adapted to preferentially absorb radiation having wavelengths in the visible or infra-red spectrum.

33. A chamber according to claim 31 wherein the wall comprises a coating having the radiation absorbing surface thereon.

34. substrate processing apparatus comprising:
a chamber comprising a substrate support, the chamber having a wall comprising a radiation absorbing surface comprising a mixture of zirconium oxide and aluminum oxide; and
a heat source to provide radiation to the radiation absorbing surface.

35. A chamber according to claim 34 wherein the radiation absorbing surface comprises a substantially dark color adapted to preferentially absorb radiation having wavelengths in the visible or infra-red spectrum.

36. A chamber according to claim 34 wherein the wall comprises a coating having the radiation absorbing surface thereon.

* * * * *